(12) United States Patent
Yang et al.

(10) Patent No.: US 11,171,047 B2
(45) Date of Patent: Nov. 9, 2021

(54) FLUORINE-DOPED NITRIDE FILMS FOR IMPROVED HIGH-K RELIABILITY

(71) Applicant: Applied Materials, Inc., Santa Clara, CA (US)

(72) Inventors: Yixiong Yang, Fremont, CA (US); Srinivas Gandikota, Santa Clara, CA (US); Steven C. H. Hung, Sunnyvale, CA (US); Jacqueline S. Wrench, San Jose, CA (US); Yongjing Lin, San Jose, CA (US); Susmit Singha Roy, Sunnyvale, CA (US); Wei V. Tang, Santa Clara, CA (US); Shih Chung Chen, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/914,414

(22) Filed: Jun. 28, 2020

(65) Prior Publication Data
US 2020/0411373 A1    Dec. 31, 2020

Related U.S. Application Data

(60) Provisional application No. 62/868,848, filed on Jun. 28, 2019.

(51) Int. Cl.
*H01L 21/00* (2006.01)
*H01L 21/768* (2006.01)
*H01L 21/02* (2006.01)

(52) U.S. Cl.
CPC .... *H01L 21/76856* (2013.01); *H01L 21/0228* (2013.01); *H01L 21/02181* (2013.01); *H01L 21/02183* (2013.01); *H01L 21/02186* (2013.01)

(58) Field of Classification Search
None
See application file for complete search history.

(56) References Cited

U.S. PATENT DOCUMENTS

| 5,393,565 | A   | 2/1995  | Suzuki et al. |
|-----------|-----|---------|---------------|
| 7,045,430 | B2* | 5/2006  | Ahn .................. H01L 21/02178 257/E21.274 |
| 7,378,350 | B2  | 5/2008  | Dalton et al. |
| 8,637,390 | B2  | 1/2014  | Ganguli et al. |
| 9,082,702 | B2  | 7/2015  | Lei et al. |
| 9,112,137 | B2  | 8/2015  | Kim et al. |
| 9,196,476 | B2  | 11/2015 | Sano et al. |
| 9,394,609 | B2  | 7/2016  | Mantymaki et al. |

(Continued)

FOREIGN PATENT DOCUMENTS

| JP | 2017521549 A | 8/2017 |
| KR | 101013231 B1 | 2/2011 |

OTHER PUBLICATIONS

PCT International Search Report and Written Opinion in PCT/US2020/040032 dated Oct. 12, 2020, 11 pages.

*Primary Examiner* — Reema Patel
(74) *Attorney, Agent, or Firm* — Servilla Whitney LLC

(57) ABSTRACT

Methods of forming semiconductor device with fluorine-incorporated metal nitride films are described. A substrate surface is exposed to a metal fluoride precursor to form a metal-fluorine species on the substrate surface. The substrate surface is exposed to a nitriding agent to react with the metal-fluorine species to form a fluorine-incorporated metal nitride film.

18 Claims, 3 Drawing Sheets

(56) References Cited

U.S. PATENT DOCUMENTS

| | | | |
|---|---|---|---|
| 9,441,294 B2 | 9/2016 | Yamamoto et al. | |
| 9,508,543 B2 | 11/2016 | Orihashi et al. | |
| 10,163,657 B1* | 12/2018 | Wang | H01L 21/3215 |
| 2002/0033535 A1* | 3/2002 | Babich | H01L 21/76829 |
| | | | 257/758 |
| 2005/0064701 A1 | 3/2005 | Dalton et al. | |
| 2008/0041308 A1 | 2/2008 | Hong et al. | |
| 2010/0240216 A1 | 9/2010 | Tada et al. | |
| 2012/0205720 A1 | 8/2012 | Forbes et al. | |
| 2012/0269962 A1 | 10/2012 | Blomberg et al. | |
| 2015/0132938 A1* | 5/2015 | Ahmed | H01L 21/28176 |
| | | | 438/591 |
| 2015/0279680 A1 | 10/2015 | Kashefi et al. | |
| 2018/0094352 A1 | 4/2018 | Mane et al. | |

* cited by examiner

FLUORINE-DOPED NITRIDE FILMS FOR IMPROVED HIGH-K RELIABILITY

CROSS-REFERENCE TO RELATED APPLICATIONS

This application claims priority to U.S. Provisional Application No. 62/868,848, filed Jun. 28, 2019, the entire disclosure of which is hereby incorporated by reference herein.

TECHNICAL FIELD

Embodiments of the present disclosure generally relate to methods for depositing high-k films. In particular, embodiments of the disclosure are directed to methods for depositing high-k films with uniform fluorine composition.

BACKGROUND

High dielectric constant (k) films are used in a large number of semiconductor devices. For example, high-k films are used in metal gates, with transistors and with metal-oxide semiconductor capacitors (MOSCAPs). The overall reliability of high-k films can be an issue due a number of factors. High-k films are known to suffer from hysteresis; with repeated voltage cycling showing shifts in the capacitance performance.

Conventional deposition techniques for high-k films form defects that significantly deteriorate device reliability. These defects include oxygen vacancies formed in the dielectric layer. These oxygen vacancies trap charge, contributing to the hysteresis effects.

Fluorine doping may be able to displace or occupy at least some of the oxygen vacancies. Current fluorine doping is performed in multiple step processes at higher temperatures resulting in increased manufacturing costs and adds sources for potential contamination and/or damage. Accordingly, there is a need for methods of forming high-k films with improved reliability.

SUMMARY

One or more embodiments of the disclosure are directed to methods of forming a semiconductor device. A substrate surface is exposed to a metal fluoride precursor to form a metal-fluorine species on the substrate surface. The substrate surface is then exposed to a nitriding agent to react with the metal-fluorine species to form a fluorine-incorporated metal nitride film.

Additional embodiments of the disclosure are directed to methods of forming a semiconductor device comprising exposing a substrate surface comprising a high-k material to a number of deposition cycles. Each deposition cycle comprises sequential exposures to a metal fluoride precursor and a nitriding agent. The metal fluoride precursor comprises titanium tetrafluoride ($TiF_4$) to form a metal-fluorine species comprising titanium atoms on the substrate surface. The nitriding agent comprising ammonia ($NH_3$) to react with the metal-fluorine species comprising titanium atoms to form a fluorine-incorporated metal nitride film comprising titanium atoms on the high-k material. The high-k material has a first number of oxygen vacancies and a first fluorine composition before formation of the metal-fluorine species comprising titanium atoms and a second number of oxygen vacancies less than the first number of oxygen vacancies and a second fluorine composition greater than the first fluorine composition after formation of the metal-fluorine species comprising titanium atoms.

Further embodiments of the disclosure are directed to methods of forming a semiconductor device comprising forming a high-k material comprising hafnium oxide ($HfO_2$) on a substrate comprising at least one feature. A thickness of a fluorine-incorporated titanium nitride film is formed on the high-k material to increase a fluorine composition of the high-k material and decrease a number of oxygen vacancies in the high-k material. Forming the fluorine-incorporated titanium nitride film comprises sequentially exposing the substrate to a titanium fluoride precursor and an ammonia nitriding agent.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
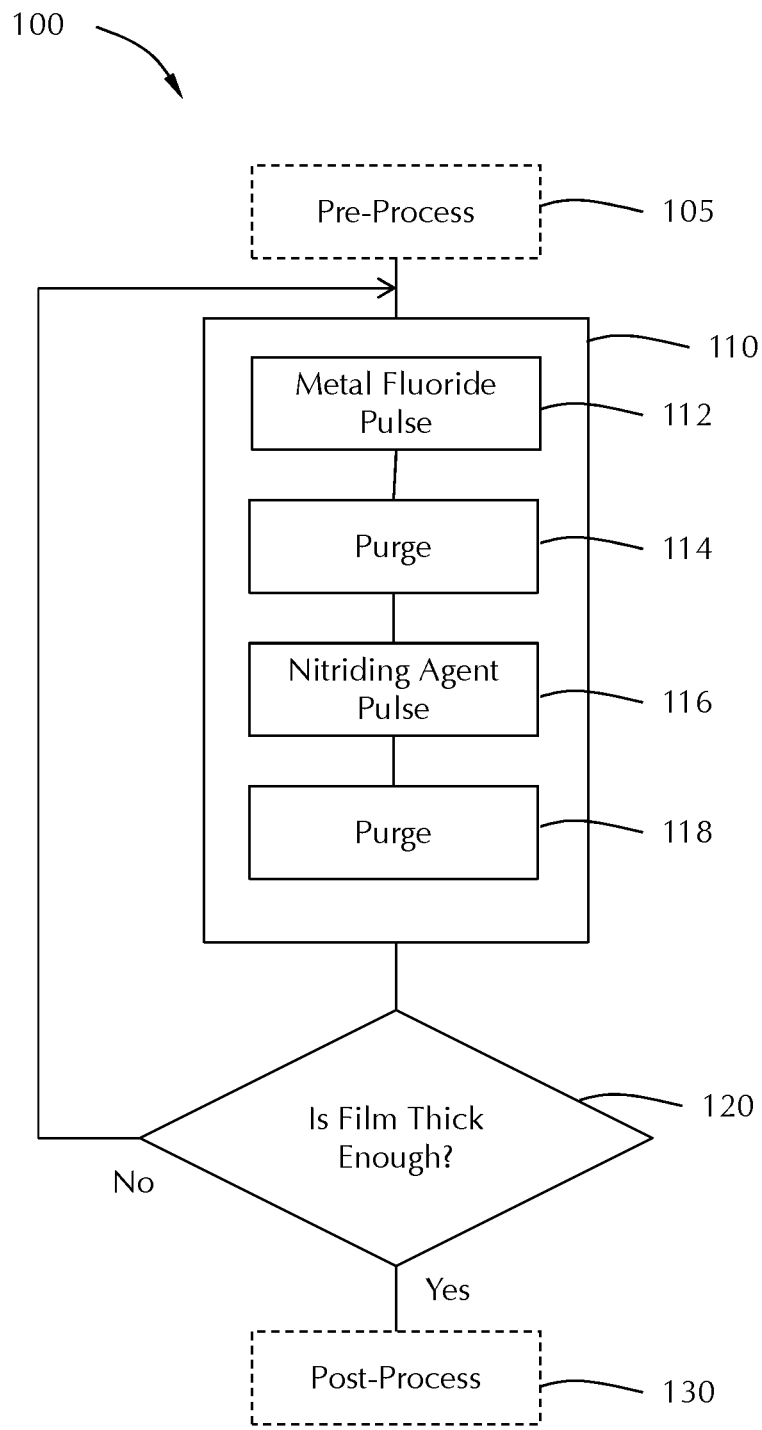
FIG. 1 shows a flowchart of exemplary method according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers.

Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure advantageously provide methods to decrease oxygen vacancies in a high-k dielectric. One or more embodiments advantageously provide methods prevent film degradation of high-k dielectric films. One or more embodiments advantageously provide methods of tuning fluorine content in a high-k dielectric film. Some embodiments advantageously provide methods of depositing fluorine-incorporated metal nitride films with uniform fluorine content through the film thickness. Some embodiments advantageously provide methods of forming conformal fluorine-incorporated metal nitride films without plasma or ion implantation processes. One or more embodiments of the disclosure are directed to high-k stacks for transistors and/or metal gates. Some embodiments of the disclosure provide integrated methods for forming fluorine-incorporated metal nitride films.

Figures 2A, 2B:
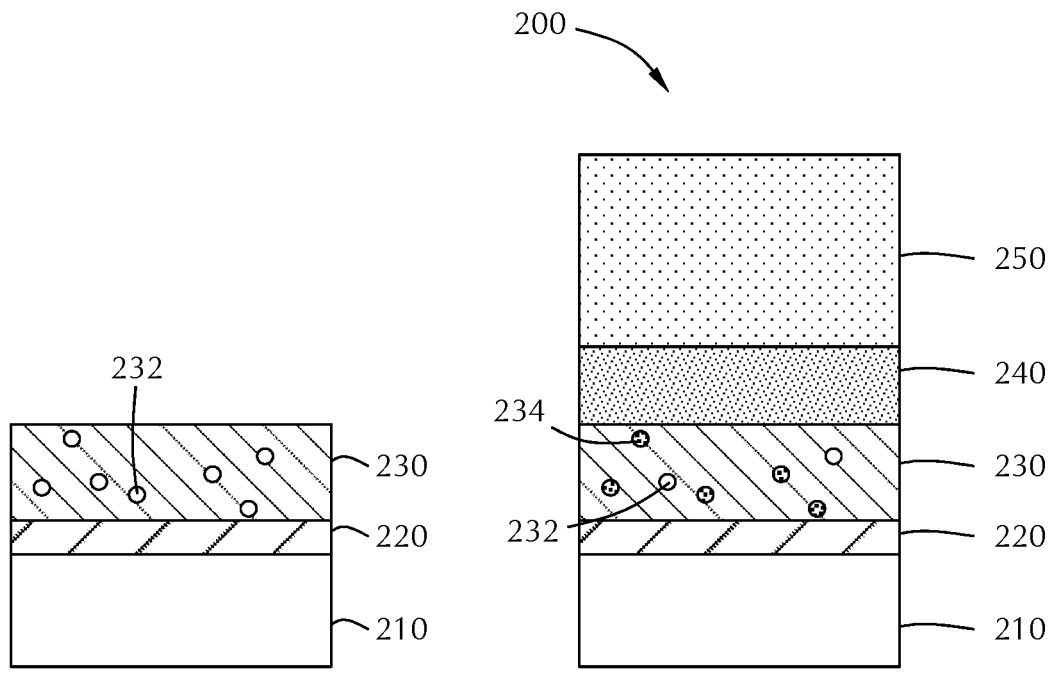
FIG. 2A shows a semiconductor device before formation of a fluorine-incorporated metal nitride film according to one or more embodiment of the disclosure.
FIG. 2B shows the semiconductor device of FIG. 2A after formation of the fluorine-incorporated metal nitride film according to one or more embodiment.

FIG. 1 illustrates a flowchart for an exemplary method 100 according to one or more embodiment of the disclosure. FIGS. 2A and 2B illustrate formation of an exemplary semiconductor device 200 according to one or more embodiment of the disclosure.

Referring to FIGS. 1, 2A and 2B, the method 100 begins with an optional pre-process operation 105. The pre-process operation 105 can be any suitable process or processes to prepare a substrate. In some embodiments, the pre-process operation 105 comprises one or more of removing a native oxide from a substrate 210 (not shown), forming an oxide layer 220 on the substrate 210; forming a high-k material 230 on the substrate 210 or on the oxide layer 220. The high-k material 230, as shown in FIG. 2A, has a first number of oxygen vacancies 232 within the film. The oxygen vacancies 232 can cause film degradation and poor performance of the high-k material 230.

In operation 110, a fluorine-incorporated metal nitride film 240 is formed. The fluorine-incorporated metal nitride film 240 is also referred to as an MN(F) film. In some embodiments, the 'M' in the formula is replaced with an element; for example, TiN(F) to indicate a fluorine-incorporated titanium nitride film.

In some embodiments, operation 110 comprises an atomic layer deposition (ALD) method which comprises a plurality of processes performed in a suitable processing chamber. The ALD process comprises at least one deposition cycle comprising sequential exposures of the substrate surface to a first reactive gas and a second reactive gas.

In process 112, the substrate is exposed to a metal fluoride precursor in the processing chamber to form a metal-fluorine species on the substrate surface. The processing chamber is then purged in process 114 of unreacted metal fluoride precursor, reaction products and byproducts. After purging, in process 116, the substrate surface is exposed to a nitriding agent to react with the metal-fluorine species to form a fluorine-incorporated metal nitride film 240. The processing chamber is then purged in process 118 to remove unreacted nitriding agent, reaction products and byproducts.

At decision point 120, the method 100 repeats the deposition cycle of operation 110 if the fluorine-incorporated metal nitride film 240 has not reached a predetermined thickness. In some embodiments, the predetermined thickness is in the range of about 2 Å to about 50 Å, or in the range of about 3 Å to about 40 Å, or in the range of about 5 Å to about 30 Å, or in the range of about 5 Å to about 20 Å, or in the range of about 7 Å to about 15 Å.

The metal fluoride precursor can comprise any suitable metal. In some embodiments, the metal fluoride precursor comprises a metal selected from one or more of titanium (Ti), tantalum (Ta), tungsten (W), ruthenium (Ru) or molybdenum (Mo). In some embodiments, the metal fluoride precursor comprises a metal consisting essentially of one or more of titanium (Ti), tantalum (Ta), tungsten (W), ruthenium (Ru) or molybdenum (Mo). As used in this manner, the term "consists essentially of" means that the metal atoms in the metal fluoride precursor or the metal fluoride species are greater than or equal to about 95%, 98%, 99% or 99.5% of the stated specie or sum of the species. In one or more embodiments, the metal fluoride precursor comprises titanium tetrafluoride ($TiF_4$). In one or more embodiments, the metal fluoride precursor consists essentially of titanium tetrafluoride ($TiF_4$).

The nitriding agent can comprise any suitable reactive species capable of nitriding the metal-fluorine species on the substrate surface. In some embodiments, the nitriding agent comprises one or more of ammonia ($NH_3$), molecular nitrogen ($N_2$), dinitrogen monoxide ($N_2O$), nitrogen monoxide (NO), nitrogen dioxide ($NO_2$) or hydrazine ($N_2H_2$). In some embodiments, the nitriding agent consists essentially of one or more of ammonia ($NH_3$), molecular nitrogen ($N_2$), dinitrogen monoxide ($N_2O$), nitrogen monoxide (NO), nitrogen dioxide ($NO_2$) or hydrazine ($N_2H_2$). As used in this manner, the term "consists essentially of" means that the nitriding agent has greater than or equal to about 95%, 98%, 99% or 99.5% of the stated species. In some embodiments, the nitriding agent comprises or consists essentially of ammonia. In some embodiments, the nitriding agent does not include a plasma.

The substrate 210 surface of some embodiments is a high-k material. The high-k material of some embodiments comprises or consists essentially of hafnium oxide ($HfO_2$). As shown in FIGS. 2A and 2B, the high-k material 230 has a first number of oxygen vacancies 232 before formation of the fluorine-incorporated metal nitride film 240, as shown in FIG. 2A, and a second number of oxygen vacancies 232 after formation of the fluorine-incorporated metal nitride film 240, as shown in FIG. 2B. The second number of oxygen vacancies 232 is smaller than the first number of oxygen vacancies 232. In some embodiments, the number of oxygen vacancies 232 is decreased by the greater than or equal to about 10%, 20%, 30%, 40%, 50%, 60%, 70%, 80% or 90%.

In some embodiments, after formation of the fluorine-incorporated metal nitride film, the high-k material 230 has an oxygen content less than or equal to about 5, 4.5, 4.25, 4, 3.75, 3.5, 3.25 or 3 atomic percent.

The high-k material 230 has a first fluorine 234 composition before formation of the fluorine-incorporated metal nitride film 240, as shown in FIG. 2A, and a second fluorine 234 composition after formation of the fluorine-incorporated metal nitride film 240, as shown in FIG. 2B. In some embodiments, the second fluorine composition is in the range of about 2 to about 30 atomic percent, or in the range of about 2.5 to about 20 atomic percent, or in the range of about 3 to about 15 atomic percent, or in the range of about 3.5 to about 10 atomic percent.

According to some embodiments, after formation of the fluorine-incorporated metal nitride film 240, the fluorine composition of the high-k material 230 is substantially uniform throughout the thickness of the high-k material 230. As used in this manner, the term "substantially uniform" means that there is no concentration gradient of fluorine atoms in the high-k material 230, or that the fluorine composition at the top of the high-k material 230 is within ±60% of the fluorine composition at the bottom of the high-k material 230.

Figure 3:
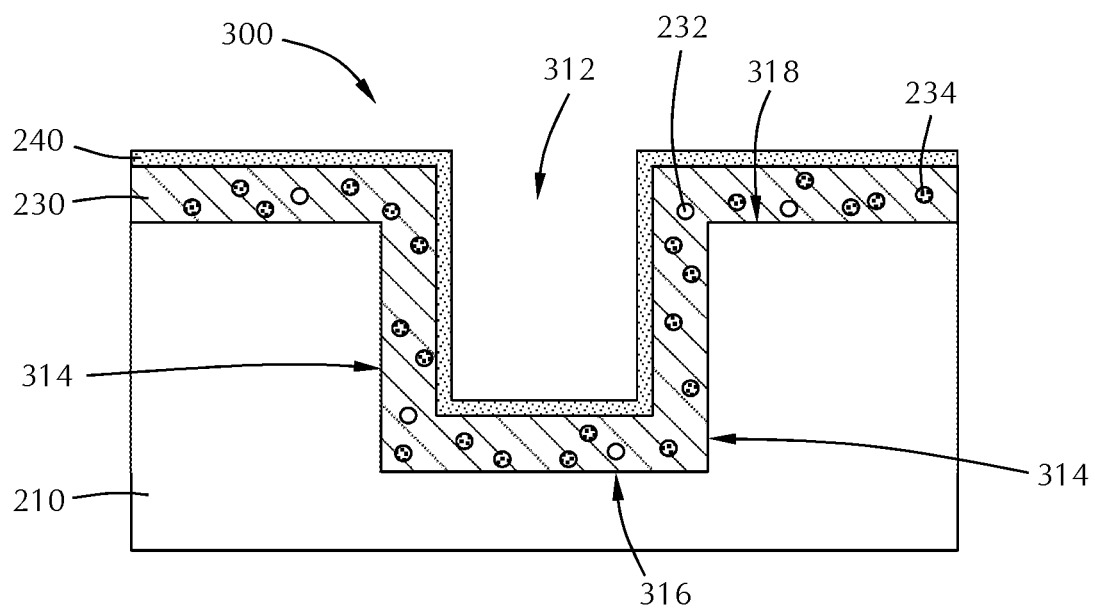
FIG. 3 shows a semiconductor device of one or more embodiment of the disclosure.

With reference to FIG. 3, in some embodiments, the substrate 210 comprises at least one feature 312. The feature 312 can be, for example, a trench, via or fin. The feature 312 illustrated in FIG. 3 is a trench; however, the skilled artisan will recognize that this is merely representative of one possible configuration. The feature 312 comprises sidewalls 314, a bottom 316 and a top 318. In some embodiments, the fluorine-incorporated metal nitride film 240 is a conformal film.

The fluorine-incorporated metal nitride film 240 of some embodiments has a surface roughness less than or equal to about 0.4 nm (Rms), as measured by atomic force microscopy (AFM). In some embodiments, the surface roughness of the fluorine-incorporated metal nitride film 240 on a high-k material 230 is less than or equal to about 0.4, 0.3, 0.25 or 0.2 nm (Rms) as measured by AFM.

The fluorine-incorporated metal nitride film 240 of some embodiments has a resistivity less than or equal to about 2000, 1500 or 1000 μohm-cm.

In some embodiments, the fluorine-incorporated metal nitride film 240 is formed at a temperature in the range of about 250° C. to about 600° C., or in the range of about 300° C. to about 550° C., or in the range of about 350° C. to about 500° C.

Referring back to FIG. 1, if decision point 120 indicates that the film has been formed to the predetermined thickness, the method 100 proceeds to an optional post-process 130. The post-process 130 can be any suitable process including, but not limited to, annealing, planarizing, removing from the processing chamber, moving to another processing chamber, or forming a metal gate 250 on the fluorine-incorporated metal nitride film 240, as shown in FIG. 2B. In some embodiments, the post-process 130 comprises annealing the film in an environment comprising one or more of argon (Ar), molecular hydrogen ($H_2$) or molecular nitrogen ($N_2$). In some embodiments, annealing the fluorine-incorporated metal nitride film 240 causes a decrease in the fluorine content in the high-k material 230. In some embodiments, the fluorine content in the high-k material 230 can be further tuned by an annealing process under suitable conditions.

Additional embodiments of the disclosure are directed to processing tools 900 for the formation of the fluorine-incorporated metal nitride film described.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, an annealing chamber, an etching chamber, and an atomic layer deposition (ALD) chamber. The particular arrangement of process chambers and components can be varied depending on the cluster tool and should not be taken as limiting the scope of the disclosure.

In one or more embodiments, the cluster tool 900 includes a metal chamber to deposit a metal, and a metal cap chamber to deposit a metal cap. The metal and/or metal cap deposition chambers of some embodiments comprises an atomic layer deposition chamber, a plasma enhanced atomic layer deposition chamber, or a spatial atomic layer deposition chamber. In one or more embodiments, the cluster tool 900 includes a pre-cleaning chamber connected to the central transfer station.

Figure 4:
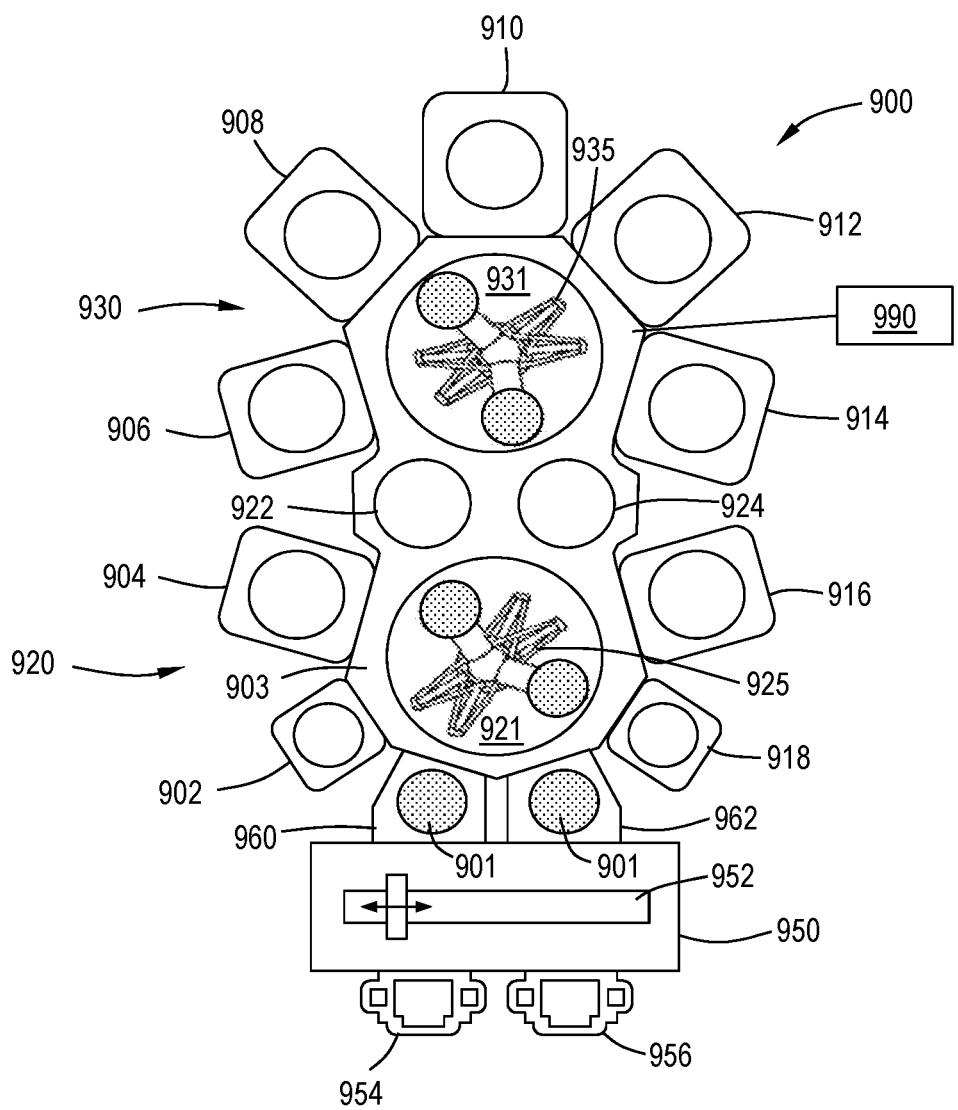
FIG. 4 illustrates a cluster tool according to one or more embodiment of the disclosure.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, the processing tool 900 comprises a central transfer station 921, 931 comprising at least one robot 925, 935 configured to move a wafer; one or more processing station connected to the central transfer station; an atomic layer deposition (ALD) station connected to the central transfer station; an annealing station; and at least one controller connected to the one or more processing station, the ALD station or the optional pre-clean station. In one or more embodiments, the at least one controller has at least one configuration selected from: a configuration to move the wafer between stations using the robot; a configuration to deposit a fluorine-incorporated metal nitride film; a configuration to perform an anneal of the substrate without exposing the substrate to oxygen. Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:
   exposing a substrate surface comprising a high-k material to a metal fluoride precursor to form a metal-fluorine species on the substrate surface;
   exposing the substrate surface to a nitriding agent to react with the metal-fluorine species to form a fluorine-incorporated metal nitride film;
   repeating exposure to the metal fluoride precursor and the nitriding agent to form a fluorine-incorporated metal nitride film with a predetermined thickness; and
   annealing the fluorine-incorporated metal nitride film to decrease a fluorine content of the high-k material.

2. The method of claim 1, wherein the metal fluoride comprises a metal selected from one or more of titanium (Ti), tantalum (Ta), tungsten (W), ruthenium (Ru) or molybdenum (Mo).

3. The method of claim 1, wherein the nitriding agent comprises one or more of ammonia ($NH_3$), molecular nitrogen ($N_2$), dinitrogen monoxide ($N_2O$), nitrogen monoxide (NO), nitrogen dioxide ($NO_2$) or hydrazine ($N_2H_2$).

4. The method of claim 3, wherein the nitriding agent is not a plasma.

5. The method of claim 1, wherein the high-k material comprises hafnium oxide ($HfO_2$).

6. The method of claim 1, wherein the high-k material has a first number of oxygen vacancies before formation of the fluorine-incorporated metal nitride film and a second number of oxygen vacancies smaller than the first number of oxygen vacancies after formation of the fluorine-incorporated metal nitride film.

7. The method of claim 6, wherein the high-k material has an oxygen content less than or equal to 4.5 atomic percent.

8. The method of claim 1, wherein the high-k material has a first fluorine composition before formation of the fluorine-incorporated metal nitride film and a second fluorine composition greater than the first fluorine composition after formation of the fluorine-incorporated metal nitride film.

9. The method of claim 1, wherein the high-k material has a uniform fluorine content through a thickness of the high-k material after formation of the fluorine-incorporated metal nitride film.

10. The method of claim 9, wherein the fluorine content is in the range of 2 to 30 atomic percent.

11. The method of claim 1, wherein the substrate surface comprises at least one surface feature having sidewalls, a top and a bottom.

12. The method of claim 11, wherein the fluorine-incorporated metal nitride film is a conformal film.

13. The method of claim 12, wherein the fluorine-incorporated metal nitride film is a capping layer having a thickness in the range of 5 Å to 30 Å.

14. The method of claim 12, wherein the fluorine-incorporated metal nitride film has a surface roughness less than or equal to 0.4 nm (Rms) by atomic force microscopy (AFM).

15. The method of claim 12, wherein the fluorine-incorporated metal nitride film has a resistivity less than or equal to 2000 μohm-cm.

16. The method of claim 1, wherein the fluorine-incorporated metal nitride film is formed at a temperature in the range of 250° C. to 600° C.

17. A method of forming a semiconductor device, the method comprising:

exposing a substrate surface comprising a high-k material to a number of deposition cycles, each deposition cycle comprising sequential exposure to a metal fluoride precursor and a nitriding agent, the metal fluoride precursor comprising titanium tetrafluoride ($TiF_4$) to form a metal-fluorine species comprising titanium atoms on the substrate surface, the nitriding agent comprising ammonia ($NH_3$) to react with the metal-fluorine species comprising titanium atoms to form a fluorine-incorporated metal nitride film comprising titanium atoms on the high-k material; and annealing the fluorine-incorporated metal nitride film to decrease a fluorine content of the high-k material, wherein the high-k material has a first number of oxygen vacancies and a first fluorine composition before formation of the metal-fluorine species comprising titanium atoms and a second number of oxygen vacancies less than the first number of oxygen vacancies and a second fluorine composition greater than the first fluorine composition after formation of the metal-fluorine species comprising titanium atoms.

18. A method of forming a semiconductor device, the method comprising:

forming a high-k material comprising hafnium oxide ($HfO_2$) on a substrate comprising at least one feature; and forming a thickness of a fluorine-incorporated titanium nitride film on the high-k material to increase a fluorine composition of the high-k material and decrease a number of oxygen vacancies in the high-k material; and annealing the fluorine-incorporated titanium nitride film to decrease a fluorine content of the high-k material, wherein forming the fluorine-incorporated titanium nitride film comprises sequentially exposing the substrate to a titanium fluoride precursor and an ammonia nitriding agent.

* * * * *